United States Patent
Yu

(10) Patent No.: US 8,081,765 B2
(45) Date of Patent: Dec. 20, 2011

(54) VOLUME ADJUSTING SYSTEM AND METHOD

(75) Inventor: Kuei-Sung Yu, Tu-Cheng (TW)

(73) Assignee: Chi Mei Communication Systems, Inc., Tu-Cheng, New Taipei (TW)

( * ) Notice: Subject to any disclaimer, the term of this patent is extended or adjusted under 35 U.S.C. 154(b) by 474 days.

(21) Appl. No.: 12/417,770

(22) Filed: Apr. 3, 2009

(65) Prior Publication Data

US 2010/0111328 A1    May 6, 2010

(30) Foreign Application Priority Data

Oct. 31, 2008  (TW) ................................ 97142108 A

(51) Int. Cl.
*H03G 3/20* (2006.01)
*G10L 15/00* (2006.01)
(52) U.S. Cl. .......................................... 381/57; 704/258
(58) Field of Classification Search .............. 381/57–58, 381/104–107; 704/258, 275; 257/254, 416
See application file for complete search history.

(56) References Cited

U.S. PATENT DOCUMENTS

| | | | |
|---|---|---|---|
| 7,490,042 B2 * | 2/2009 | Eide et al. | 704/270 |
| 8,050,926 * | 11/2011 | Huang | 704/258 |

* cited by examiner

*Primary Examiner* — Calvin Lee
(74) *Attorney, Agent, or Firm* — Altis Law Group, Inc.

(57) ABSTRACT

The invention discloses a volume adjusting system and a volume adjusting method. The volume adjusting system includes a volume receiving module, a volume auto-adjusting module, and a volume output module. The volume receiving module is configured for receiving an external sound from an external sound source. The volume auto-adjusting module is connected to the volume receiving module and configured for analyzing the external sound from the volume receiving module and an action of a user of the electronic device, to determine an analysis value corresponding the external sound and the action of the user, automatically adjusting an output volume according to the analysis value, and storing a plurality of volume values corresponding to different analysis values of external sound and user actions. The volume output module is connected to the volume auto-adjusting module, and configured for outputting sound according to the output volume.

5 Claims, 2 Drawing Sheets

VOLUME ADJUSTING SYSTEM AND METHOD

BACKGROUND

1. Technical Field

The present disclosure generally relates to volume adjusting systems and methods, and particularly to a volume adjusting system and method used in an electronic device.

2. Discussion of the Related Art

Portable electronic devices are often used in a variety of environments where the volume of the music may need to be changed according to ambient noise of the surrounding environment. For example, when the environment is noisy (e.g. in a market), the volume should be turned up, or when the environment is quiet (e.g. in a library), then the volume should be turned down.

Typically, volume on a mobile phone is adjustable. The volume may be adjusted according to the noise of the surrounding environment. However, different users may have different requirements in the same environment. Thus, the mobile phone cannot satisfy requirements of different users.

Therefore, there is room for improvement within the art.

BRIEF DESCRIPTION OF THE DRAWING

Many aspects of the present electronic device can be better understood with reference to the following drawings. The components in the drawings are not necessarily drawn to scale, the emphasis instead being placed upon clearly illustrating the principles of the present volume adjusting system and method. Moreover, in the drawings, like reference numerals designate corresponding parts throughout the several views.

DETAILED DESCRIPTION

The present volume adjusting system and method may be used in electronic devices such as mobile phones, PDAs etc. For the purposes of conveniently describing one embodiment of the volume adjusting system and method, a mobile phone is used.

Figure 1:
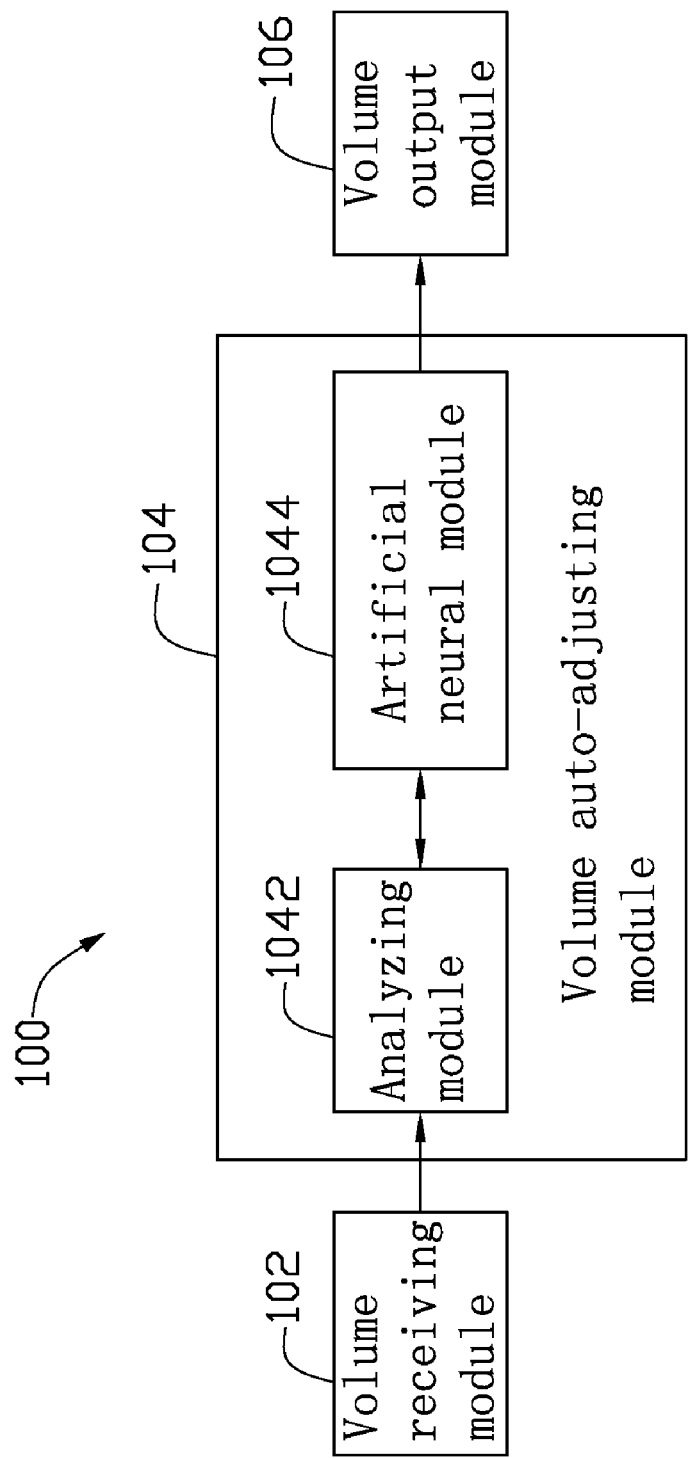
FIG. 1 shows a schematic view of a volume adjusting system.

Referring to FIG. 1, a schematic view of a volume adjusting system 100 is provided. The volume adjusting system 100 includes a volume receiving module 102, a volume auto-adjusting module 104, and a volume output module 106. The volume auto-adjusting module 104 is connected to the volume receiving module 102 and the volume output module 106. The volume adjusting system 100 may be embodied in the mobile phone.

The volume receiving module 102 includes a microphone (not shown) used to monitor and receive external noise from an external noise source. The volume receiving module 102 transfers the external noise to the volume auto-adjusting module 104.

The volume auto-adjusting module 104 includes an analyzing module 1042 connected to the volume receiving module 102 and an artificial neural module 1044 connected to the volume output module 106. The analyzing module 1042 and the artificial neural module 1044 are connected to each other such that signals and values can be transferred therebetween. The analyzing module 1042 is configured for analyzing the external noise from the volume receiving module 102 and actions of a user of the mobile phone, to get an analysis value and transferring the analysis value to the artificial neural module 1044. As an example, the external noise may be loud music from a music concert, a baby crying, loud clapping, or low noise sound in a library. The actions of the user may include listening to music or talking to someone, while the mobile phone being used in a hands free state, normal state, or earphone state, for example. The artificial neural module 1044 is configured for storing a plurality of volume values corresponding to different analysis values of outside environments and user actions, and automatically adjusting output volume of the mobile phone according to the different analysis values.

The volume output module 106 is connected to the artificial neural module 1044 to receive output volume adjustment signals from the artificial neural module 1044 and output sound at the corresponding volume. The volume output module 106 may be a normal speaker, an earphone, or a loudspeaker.

Figure 2:
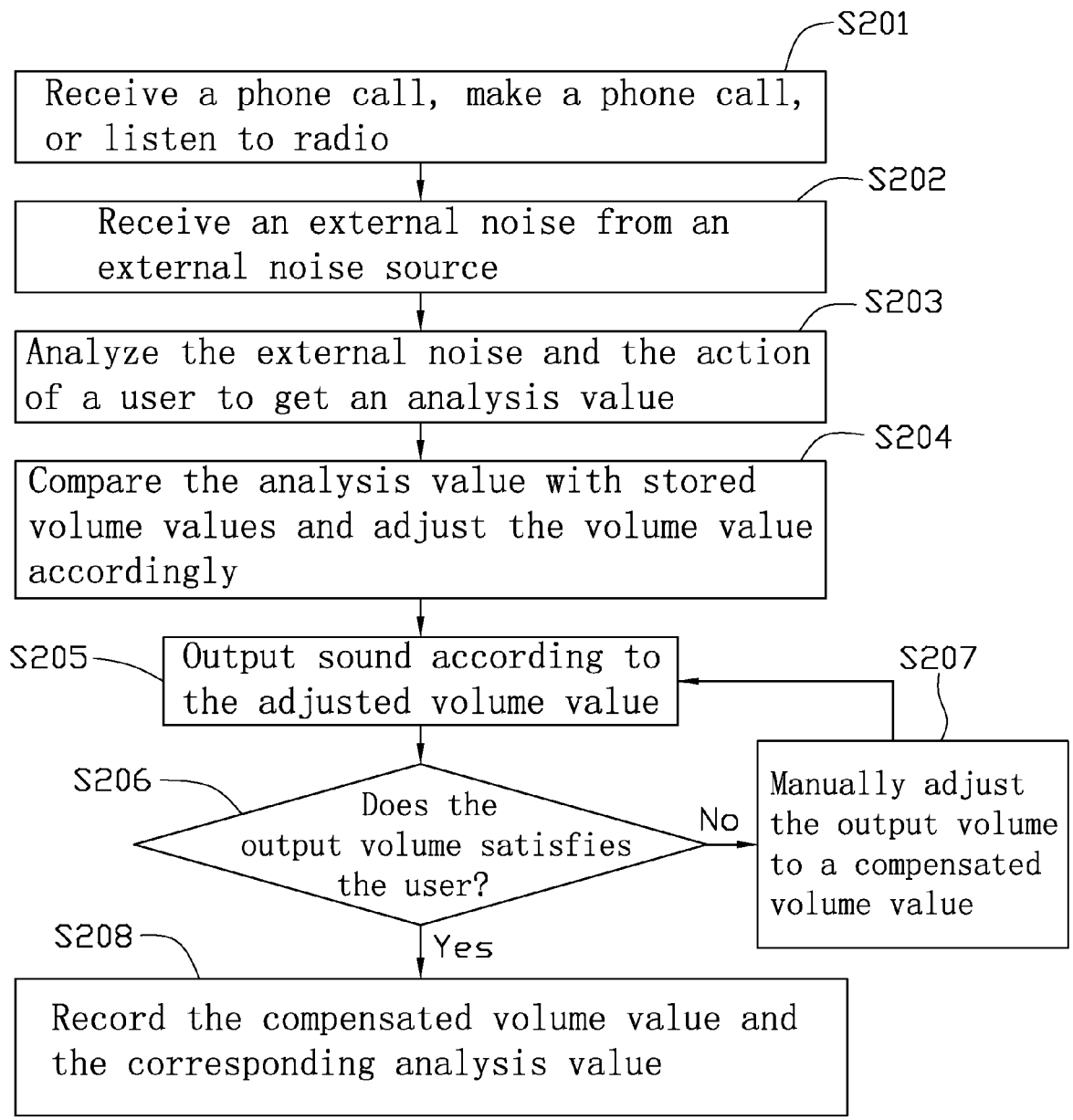
FIG. 2 shows a flowchart of one embodiment of a volume adjusting method using the volume adjusting system of FIG. 1.

Referring to FIG. 2, a volume adjusting method is shown. The volume adjusting method includes steps S201 to S208. In step S201, a user receives a phone call, makes a phone call, or listens to music or radio. In step S202, the volume receiving module 102 receives some external noise and transfers the external noise to the volume auto-adjusting module 104. In step S203, the analyzing module 1042 analyzes the external noise (via a conversion of the external noise to an electrical signal) from the volume receiving module 102 and an action of the user of the mobile phone to determine an analysis value and transfers the analysis value to the artificial neural module 1044. In step S204, the artificial neural module 1044 compares the analysis value with volume values stored in the mobile phone, determines a new volume value according to the analysis value, and automatically adjusts the output volume value of the mobile phone accordingly. Then, an adjusted volume value of the output volume is transferred to the volume output module 106. In step S205, the volume output module 106 outputs sound at that corresponding volume. In steps S206 to S208, the output volume may be adjusted by the user until the output volume satisfies the user. That is, if the output volume does not satisfy the user, the user can manually adjust the output volume to a compensated volume value, where the artificial neural module 1044 records the compensated volume value and the corresponding analysis value of outside environment and user action, for future reference. This way, at future times in a similar environment, output volume of the mobile phone will automatically be adjusted according to known user preference.

Users can select favorite output volumes for different conditions, which can be stored in the mobile phone, so that output volume can always and automatically be adjusted according to environmental conditions. Therefore, users do not need to adjust the output volume repeatedly.

Alternatively, the volume of a ring tone may also be adjusted by the volume auto-adjusting module 104 with the method similar to the output volume. That is, the volume output module 106 may be, for example, a bell that rings when there is an incoming message or call.

It is to be understood, however, that even though numerous characteristics and advantages of the present invention have been set forth in the foregoing description, with details of the structure and function of the present disclosure, the disclosure is illustrative only, and changes may be made in detail, especially in matters of shape, size, and arrangement of parts within the principles of present disclosure to the full extent indicated by the broad general meaning of the terms in which the appended claims are expressed.

What is claimed is:

1. A volume adjusting method of an electronic device comprising:
providing a volume adjusting system comprising a volume receiving module, a volume auto-adjusting module, and a volume output module;
receiving an external sound from an external sound source using the volume receiving module;
using the volume auto-adjusting module, analyzing the external sound from the volume receiving module and an action of a user of the electronic device, to determine an analysis value corresponding the external sound and the action of the user, and comparing the analysis value with volume values stored in the electronic device, and automatically adjusting an output volume according to the analysis value;
outputting sound corresponding to the output volume using the volume output module;
storing a plurality of volume values corresponding to different analysis values of external sound and user actions; and
in response to the output volume not being appropriate, the output volume being manually adjusted to a compensated volume value, and recording the compensated volume value and the corresponding analysis value of external sound and user action, and automatically adjusting the output volume value to the compensated volume value.

2. The volume adjusting method as claimed in claim 1, wherein the volume receiving module converts the external sound to an electrical signal.

3. The volume adjusting method as claimed in claim 1, wherein the appropriate volume value or the compensated volume value is directly selected by the volume auto-adjusting module when the analysis value corresponds to one of the stored plurality of volume values.

4. The volume adjusting method as claimed in claim 1, wherein the volume receiving module comprises a microphone used to receive the external sound.

5. The volume adjusting method as claimed in claim 1, wherein the volume output module comprises one or more of a speaker, an earphone, a loudspeaker, and a bell.

* * * * *